(12) United States Patent
Park

(10) Patent No.: US 9,361,977 B2
(45) Date of Patent: Jun. 7, 2016

(54) RELIABLE READ OPERATION FOR NONVOLATILE MEMORY DEVICE WITH RESISTANCE MATERIAL THAT READS DATA BASED ON REFERENCE CURRENT

(71) Applicant: SAMSUNG ELECTRONICS CO., LTD., Suwon-Si, Gyeonggi-Do (KR)

(72) Inventor: Mu-Hui Park, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/612,997

(22) Filed: Feb. 3, 2015

(65) Prior Publication Data

US 2015/0221365 A1 Aug. 6, 2015

(30) Foreign Application Priority Data

Feb. 4, 2014 (KR) ........................ 10-2014-0012619

(51) Int. Cl.
| | | |
|---|---|---|
| *G11C 11/00* | (2006.01) | |
| *G11C 13/00* | (2006.01) | |
| *G11C 11/56* | (2006.01) | |
| *G11C 29/02* | (2006.01) | |

(52) U.S. Cl.
CPC .......... *G11C 13/004* (2013.01); *G11C 11/5678* (2013.01); *G11C 13/0002* (2013.01); *G11C 13/0004* (2013.01); *G11C 13/0038* (2013.01); *G11C 13/0061* (2013.01); *G11C 29/021* (2013.01); *G11C 29/026* (2013.01); *G11C 29/028* (2013.01); *G11C 2013/0054* (2013.01); *G11C 2013/0092* (2013.01)

(58) Field of Classification Search
None
See application file for complete search history.

(56) References Cited

U.S. PATENT DOCUMENTS

| | | | | |
|---|---|---|---|---|
| 6,762,953 | B2* | 7/2004 | Tanizaki | G11C 7/04 365/158 |
| 6,967,884 | B2 | 11/2005 | Hsu | |
| 7,567,473 | B2 | 7/2009 | Breitwisch et al. | |
| 7,830,705 | B2 | 11/2010 | Jeong | |
| 8,077,507 | B2 | 12/2011 | Park | |
| 8,441,847 | B2 | 5/2013 | Eleftheriou et al. | |
| 8,467,237 | B2 | 6/2013 | Bedeschi et al. | |
| 2005/0117390 | A1* | 6/2005 | Tsuchida | G11C 11/14 365/171 |
| 2009/0213645 | A1* | 8/2009 | Parkinson | G11C 11/56 365/163 |
| 2011/0080775 | A1* | 4/2011 | Bae | G11C 7/04 365/163 |
| 2012/0026799 | A1* | 2/2012 | Lee | G11C 16/28 365/185.21 |
| 2012/0063195 | A1 | 3/2012 | Lam et al. | |
| 2013/0044540 | A1 | 2/2013 | Eleftheriou et al. | |
| 2014/0198556 | A1* | 7/2014 | Lee | G11C 7/14 365/148 |

FOREIGN PATENT DOCUMENTS

| | | |
|---|---|---|
| KR | 0944328 | 2/2010 |
| KR | 1020120091583 A | 8/2012 |
| KR | 1224328 | 1/2013 |

* cited by examiner

*Primary Examiner* — Son Dinh
*Assistant Examiner* — Sultana Begum
(74) *Attorney, Agent, or Firm* — Volentine & Whitt, PLLC

(57) ABSTRACT

Provided is a nonvolatile memory device. The nonvolatile memory device may include a resistive memory cell, a reference current generator which provides a reference current, a reference signal generator which provides a reference signal indicating a reference time for data read based on the reference current, and a read circuit which receives the reference signal and reads data by comparing a ramp-up time of a cell current flowing through the resistive memory cell with the reference time.

20 Claims, 20 Drawing Sheets

FIG. 1

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

RELIABLE READ OPERATION FOR NONVOLATILE MEMORY DEVICE WITH RESISTANCE MATERIAL THAT READS DATA BASED ON REFERENCE CURRENT

A claim of priority under 35 U.S.C. §119 is made to Korean Patent Application No. 10-2014-0012619 filed on Feb. 4, 2014, the entire contents of which are hereby incorporated by reference.

BACKGROUND

The present inventive concept relates to a nonvolatile memory device using a resistance material.

Examples of nonvolatile memories using resistance materials include phase-change random access memories (PRAMs), resistive RAMs (RRAMs), and magnetic RAMs (MRAMs). While dynamic RAMs (DRAMs) or flash memories store data using charge, nonvolatile memories using resistance materials store data according to a state change of a phase-change material such as a chalcogenide alloy (in the case of PRAMs), a resistance change of a variable resistance material (in the case of RRAMs), or a resistance change of a magnetic tunnel junction (MTJ) thin film due to a magnetization state of a ferromagnetic material (in the case of MRAMs).

In particular, the phase-change material of a PRAM may be brought to a crystalline state or an amorphous state as it is cooled after being heated. The phase-change material has low resistance in the crystalline state and has high resistance in the amorphous state. Therefore, the crystalline state may be defined for example as set data or data 0, and the amorphous state may be defined for example as reset data or data 1.

SUMMARY

Embodiments of the present inventive concept provide a memory device with improved read reliability.

According to embodiments of the present inventive concept, there is provided a nonvolatile memory device including a resistive memory cell, a reference current generator which provides a reference current, a reference signal generator which provides a reference signal indicating a reference time for data read based on the reference current, and a read circuit which receives the reference signal and reads data by comparing a ramp-up time of a cell current flowing through the resistive memory cell with the reference time.

According to other embodiments of the present inventive concept, there is provided a nonvolatile memory device including a first clamping unit which is connected between a resistive memory cell and a first sensing node and provides a clamping bias to the resistive memory cell, a first compensation unit which provides a compensation current to the first sensing node, a first sense amplifier which is connected to the first sensing node and senses a change in a level of the first sensing node in response to a reference signal, a second clamping unit which is connected between a fixed resistor and a second sensing node and provides the clamping bias to the fixed resistor, a reference current generator which provides a reference current trimmed according to a test result to the second sensing node, a second sense amplifier which is connected to the second sensing node and senses a change in a level of the second sensing node, and a pulse generator which provides the reference signal based on an output value of the second sense amplifier. The clamping bias varies over time.

BRIEF DESCRIPTION OF THE DRAWINGS

The above and other aspects and features of the inventive concept will become more apparent in view of the following description of exemplary embodiments with reference to the attached drawings, in which:

FIG. 1 is a block diagram of a nonvolatile memory device according to embodiments of the inventive concept.

DETAILED DESCRIPTION

Figure 2:
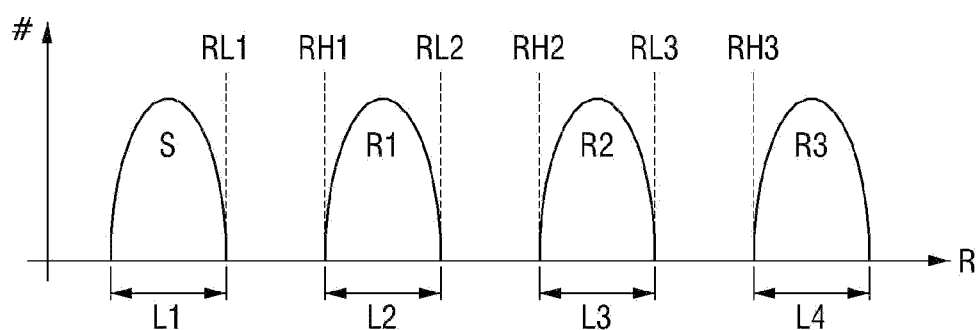
FIGS. 2 and 3 are diagrams illustrating resistance distributions of resistive memory cells used in nonvolatile memory devices according to embodiments of the inventive concept.

The inventive concept will now be described more fully hereinafter with reference to the accompanying drawings, in which preferred embodiments of the inventive concept are shown. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the inventive concept but cover all changes and modifications that can be caused due to a change in manufacturing process. Thus, regions shown in the drawings are illustrated in schematic form and the shapes of the regions are presented simply by way of illustration and not as a limitation.

Hereinafter, embodiments of the inventive concept will be described using a phase-change random access memory (PRAM). However, it will be obvious to those of ordinary skill in the art to which the inventive concept pertains that the inventive concept can be applied to other nonvolatile memories using resistance materials, such as resistive RAMs (RRAMs) and magnetic RAMs (MRAMs).

FIG. 1 is a block diagram of a nonvolatile memory device according to embodiments of the inventive concept. In FIG. 1, a nonvolatile memory device including sixteen memory banks is illustrated as an example. However, the inventive concept is not limited to this example.

Referring to FIG. 1, the nonvolatile memory device according to the embodiments of the inventive concept may include a memory cell array, a plurality of sense amplifiers and write drivers 2_1 through 2_8, and a peripheral circuit region 3.

The memory cell array may include a plurality of memory banks 1_1 through 1_16, and each of the plurality of memory banks 1_1 through 1_16 may include a plurality of memory blocks BLK0 through BLK7. Each of the plurality of memory blocks BLK0 through BLK7 may include a plurality of nonvolatile memory cells arranged in a matrix. In the embodiments of the inventive concept, a case where each of the plurality of memory banks 1_1 through 1_16 includes eight memory blocks is illustrated as an example. However, the inventive concept is not limited to this case.

Although not specifically shown in the drawing, a row select circuit and a column select circuit may be placed in order to correspond to the plurality of memory banks 1_1 through 1_16. The row select circuit and the column select circuit may respectively designate a row and a column of resistive memory cells that are to be written and read.

Each of the plurality of sense amplifiers and write drivers 2_1 through 2_8 may be placed to correspond to two of the plurality of memory banks 1_1 through 1_16, and may execute read and write operations on the two corresponding memory banks. In the embodiments of the inventive concept, a case where each of the plurality of sense amplifiers and write drivers 2_1 through 2_8 corresponds to two of the plurality of memory banks 1_1 through 1_16 is used as an example. However, the inventive concept is not limited to this case. That is, each of the plurality of sense amplifiers and write drivers 2_1 through 2_8 may correspond to one memory bank or four memory banks.

The peripheral circuit region 3 may include a plurality of logic circuit blocks and a voltage generator to operate the column select circuit, the row select circuit, and the plurality of sense amplifiers and write drivers 2_1 through 2_8.

Figure 3:
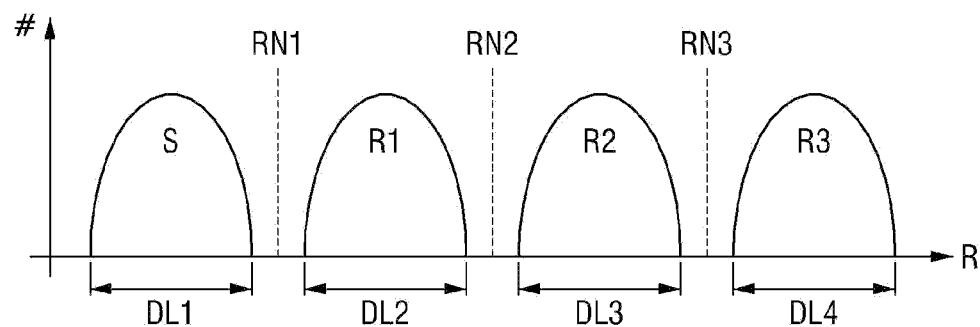

FIGS. 2 and 3 are diagrams illustrating resistance distributions of resistive memory cells used in nonvolatile memory devices according to embodiments of the inventive concept.

Referring to FIG. 2, the resistive memory cells may be multi-bit cells. Each of the resistive memory cells may store any one of first through fourth data S, R1, R2 and R3. The resistance distribution illustrated in FIG. 2 may be a distribution immediately after a write operation.

The first through fourth data S, R1, R2 and R3 may correspond to first through fourth resistance levels L1 through L4, respectively. A resistance value may increase in the order of the first, second, third and fourth resistance levels L1, L2, L3 and L4. For example, the first resistance level L1 may be smaller than RL1, the second resistance level L2 may be greater than RH1 and smaller than RL2, the third resistance level L3 may be greater than RH2 and smaller than RL3, and the fourth resistance level L4 may be greater than RH3. Here, RL1, RL2, RL3, RH1, RH2 and RH3 may be reference values used in a verify read operation for verifying whether the write operation has been performed correctly.

The resistance distribution illustrated in FIG. 3 may be a distribution for a certain period of time after a write operation. That is, first through fourth data S, R1, R2 and R3 may correspond to first through fourth resistance levels DL1 through DL4, respectively. The first through fourth resistance levels D1 through DL4 of FIG. 3 are wider than the first through fourth resistance levels L1 through L4 of FIG. 2.

RN1 is a resistance value between the first resistance level DL1 and the second resistance level DL2, RN2 is a resistance value between the second resistance level DL2 and the third resistance level DL3, and RN3 is a resistance value between the third resistance level DL3 and the fourth resistance level DL4. Here, RN1 through RN3 may be reference values used in a normal read operation. For example, a resistive memory cell having a resistance value smaller than RN1 may store the first data S.

Figure 4:
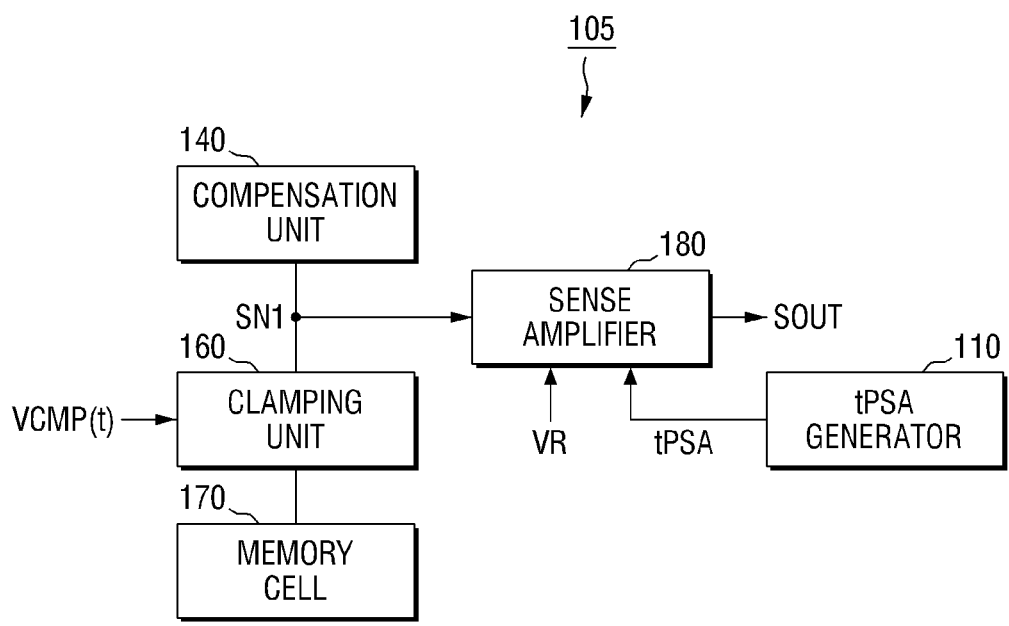
FIG. 4 is a block diagram of a nonvolatile memory device according to an embodiment of the inventive concept.
Figure 5:
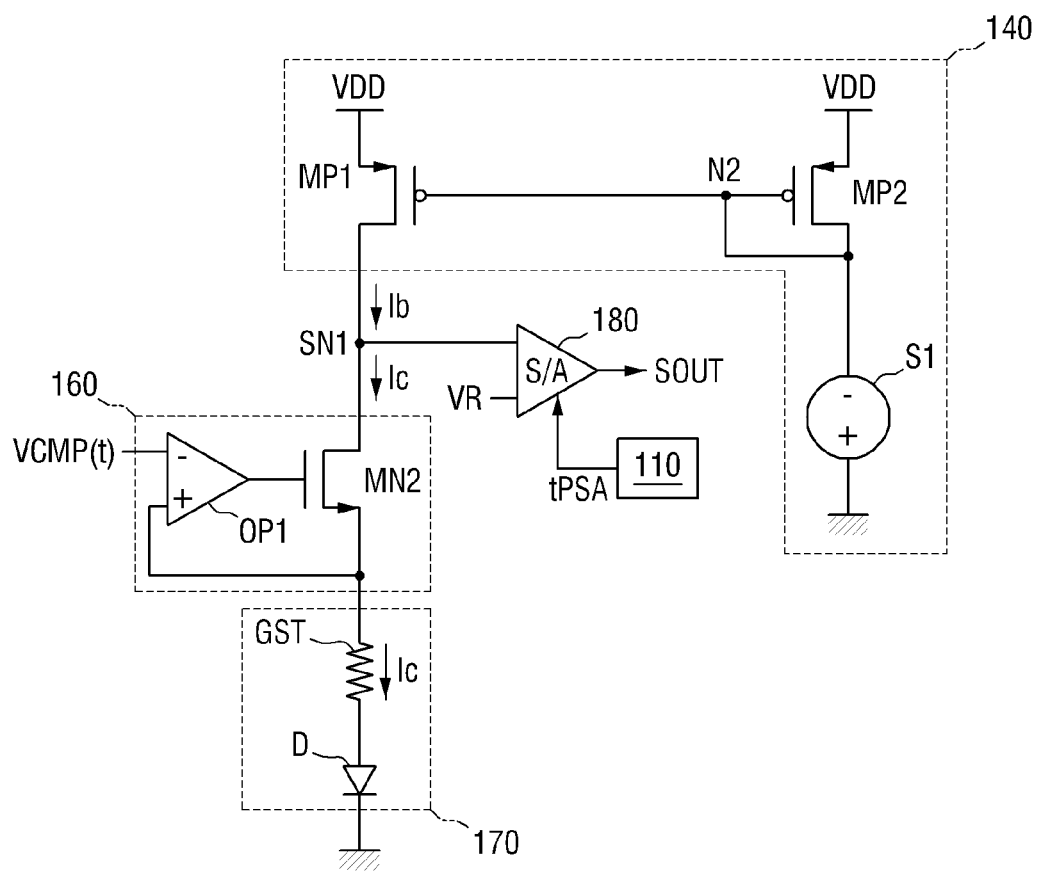
FIG. 5 is a circuit diagram of the nonvolatile memory device illustrated in FIG. 4.

FIG. 4 is a block diagram of a nonvolatile memory device according to an embodiment of the inventive concept. FIG. 5 is a circuit diagram of the nonvolatile memory device illustrated in FIG. 4.

Referring to FIGS. 4 and 5, the nonvolatile memory device according to the current embodiment may include a resistive memory cell 170, a read circuit 105, and a reference signal generator 110. The read circuit 105 may include a first sensing node SN1, a first compensation unit 140, a first clamping unit 160, and a first sense amplifier 180.

The resistive memory cell 170 shown in FIGS. 4 and 5 may be a resistive memory cell selected to be read from a plurality of resistive memory cells in a memory cell array. The resistive memory cell 170 may include a variable resistive element GST which contains a phase-change material and an access element D which controls an electric current flowing through the variable resistive element GST. Here, the access element D may be a diode or a transistor connected in series to the variable resistive element GST. In addition, examples of the phase-change material include a combination of two elements such as GaSb, InSb, InSe, $Sb_2Te_3$ or GeTe, a combination of three elements such as GeSbTe, GaSeTe, InSbTe, $SnSb_2Te_4$ or InSbGe, and a combination of four elements such as AgInSbTe, (GeSn)SbTe, GeSb(SeTe) or $Te_{81}Ge_{15}Sb_2S_2$. Among them, GeSbTe that contains germanium (Ge), antimony (Sb), and tellurium (Te) may typically be used for the phase-change material.

If the resistive memory cell 170 is an RRAM, the variable resistive element GST may include, for example, NiO or perovskite. The perovskite may be a composition such as manganite ($Pr_{0.7}Ca_{0.3}MnO_3$, $Pr_{0.5}Ca_{0.5}MnO_3$, other PCMO, LCMO, etc), titanate (STO:Cr), or zirconate (SZO:Cr, $Ca_2Nb_2O_7$:Cr, $Ta_2O_5$:Cr). A filament may be formed in the variable resistive element GST. The filament may serve as a current path of a cell current Ic that flows through the resistive memory cell 170.

The first compensation unit 140 may provide a compensation current Ib to the first sensing node SN1. Specifically, the first compensation unit 140 may provide the compensation current Ib to the first sensing node SN1 in order to compensate for a reduction in the level of the first sensing node SN1. The reduction in the level of the first sensing node SN1 may occur due to the cell current Ic that flows through the selected resistive memory cell 170. The first compensation unit 140 may include a PMOS transistor MP1 connected between a power source VDD and the first sensing node SN1, and may also include a PMOS transistor MP2 and a source 51 connected between a power source VDD and a ground source, as illustrated in FIG. 5. The two PMOS transistors MP1 and MP2 may have respective gates connected to each other, and may be in the form of current mirrors.

In nonvolatile memory devices according to embodiments of the inventive concept, even if multiple bits are stored in the resistive memory cell 170, the compensation current Ib may be constant during a read period. For example, the compensation current Ib at the time of verifying whether first data S (see FIG. 3) has been stored in the resistive memory cell 170 may be equal to the compensation current Ib at the time of verifying whether third data R2 (see FIG. 3) has been stored in the resistive memory cell 170.

The first clamping unit 160 may be connected between the resistive memory cell 170 and the first sensing node SN1, and may clamp the level of a bit line to a level within an appropriate range to read. Specifically, the first clamping unit 160 may clamp the level of the bit line to a level equal to or lower than a threshold voltage Vth of the phase-change material, because the bit line at a level higher than the threshold voltage Vth can change the phase of the phase-change material of the selected resistive memory cell 170. The first clamping unit 160 may include an NMOS transistor MN2 and an operational (OP) amplifier OP1 connected between the resistive memory cell 170 and the first sensing node SN1, as illustrated in FIG. 5.

In nonvolatile memory devices according to embodiments of the present disclosure, the first clamping unit 160 may provide a first clamping bias VCMP(t) to the resistive memory cell 170. The first clamping bias VCMP(t) may vary over time during a read period. The first clamping bias VCMP(t) may come in various forms. For example, the first clamping bias VCMP(t) may increase (ramp up) over time. Alternatively, the first clamping bias VCMP(t) may increase over time in a stepped manner or in the form of a $k^{th}$ function (where k is a natural number).

The first sense amplifier 180 may be connected to the first sensing node SN1, and senses a change in the level of the first sensing node SN1. Specifically, the first sense amplifier 180 may compare the level of the first sensing node SN1 with a reference level VR, and output a comparison result in response to a reference signal tPSA indicating a reference time for data read. The sense amplifier 180 may be a current sense amplifier or a voltage sense amplifier.

As described above, during a read period, the compensation current Ib may remain constant, and the first clamping bias VCMP(t) may vary (or ramp up) over time. In this state, the first sense amplifier 180 may be enabled multiple times in response to the reference signal tPSA which is activated multiple times during the read period.

Specifically, in nonvolatile memory devices according to embodiments of the inventive concept, a time when an output value SOUT of the first sense amplifier 180 transits may vary based on data stored in the resistive memory cell 170.

For example, if second data (e.g., R1) is stored in the resistive memory cell 170, the output value SOUT of the sense amplifier 180 may transit (e.g., from a high (H) state to a low (L) state) after a first period of time from which the first clamping bias VCMP(t) begins to be provided. On the other hand, if the third data (e.g., R2), which is different from the second data (e.g., R1), is stored in the resistive memory cell 170, the output value SOUT of the sense amplifier 180 may transit after a second period of time. The second period of time is different from the first period of time, from which the first clamping bias VCMP(t) begins to be provided. This will be described in more detail later with reference to FIGS. 6 and 8.

The reference signal generator 110 may control the first sense amplifier 180 by generating the reference signal tPSA which is activated multiple times during a read period. The reference signal generator 110 will be described in detail later with reference to FIGS. 9 through 14.

Figure 6:
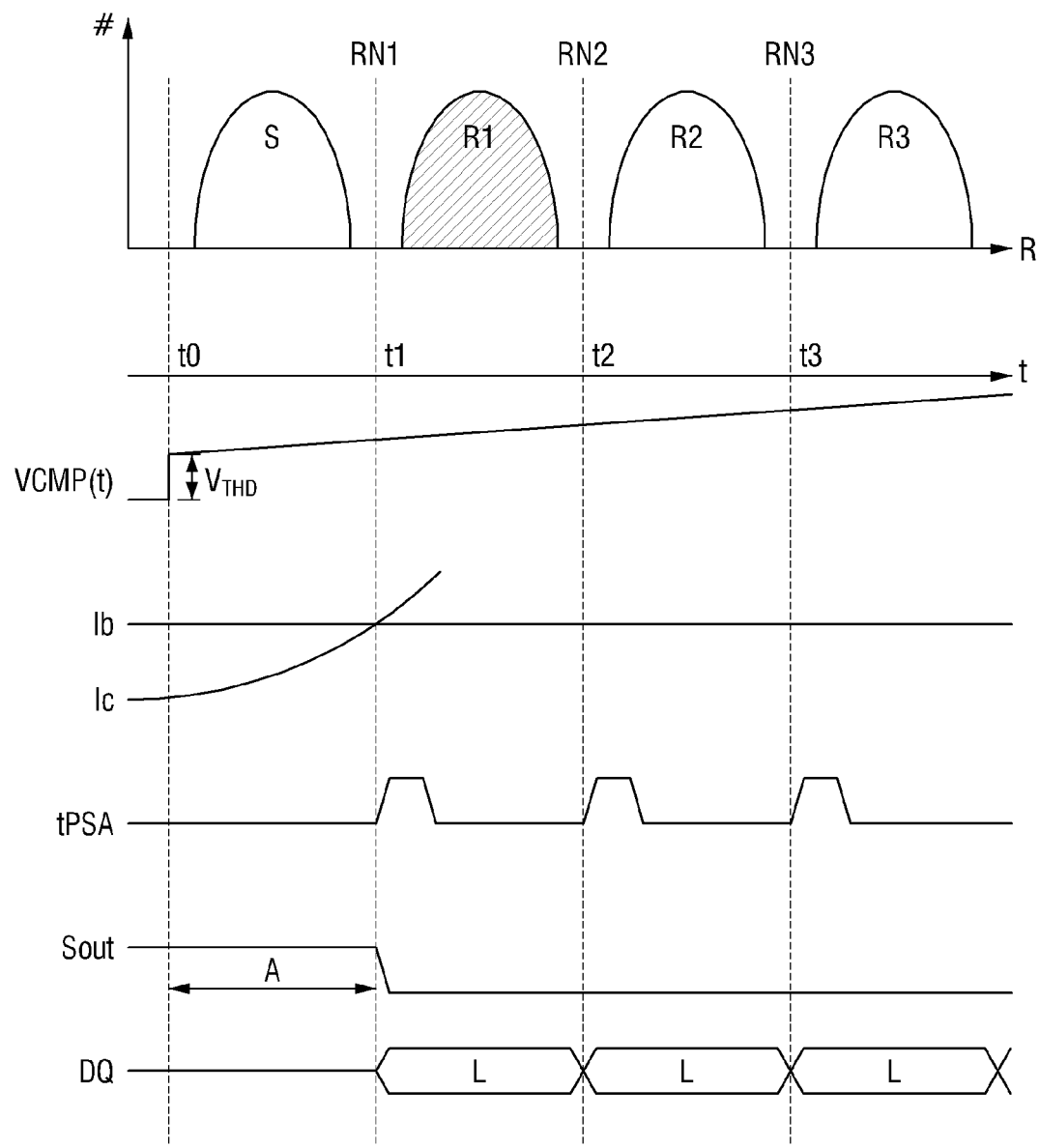
FIGS. 6, 7 and 8 are timing diagrams illustrating a method of driving a nonvolatile memory device according to embodiments of the inventive concept.
Figure 7:
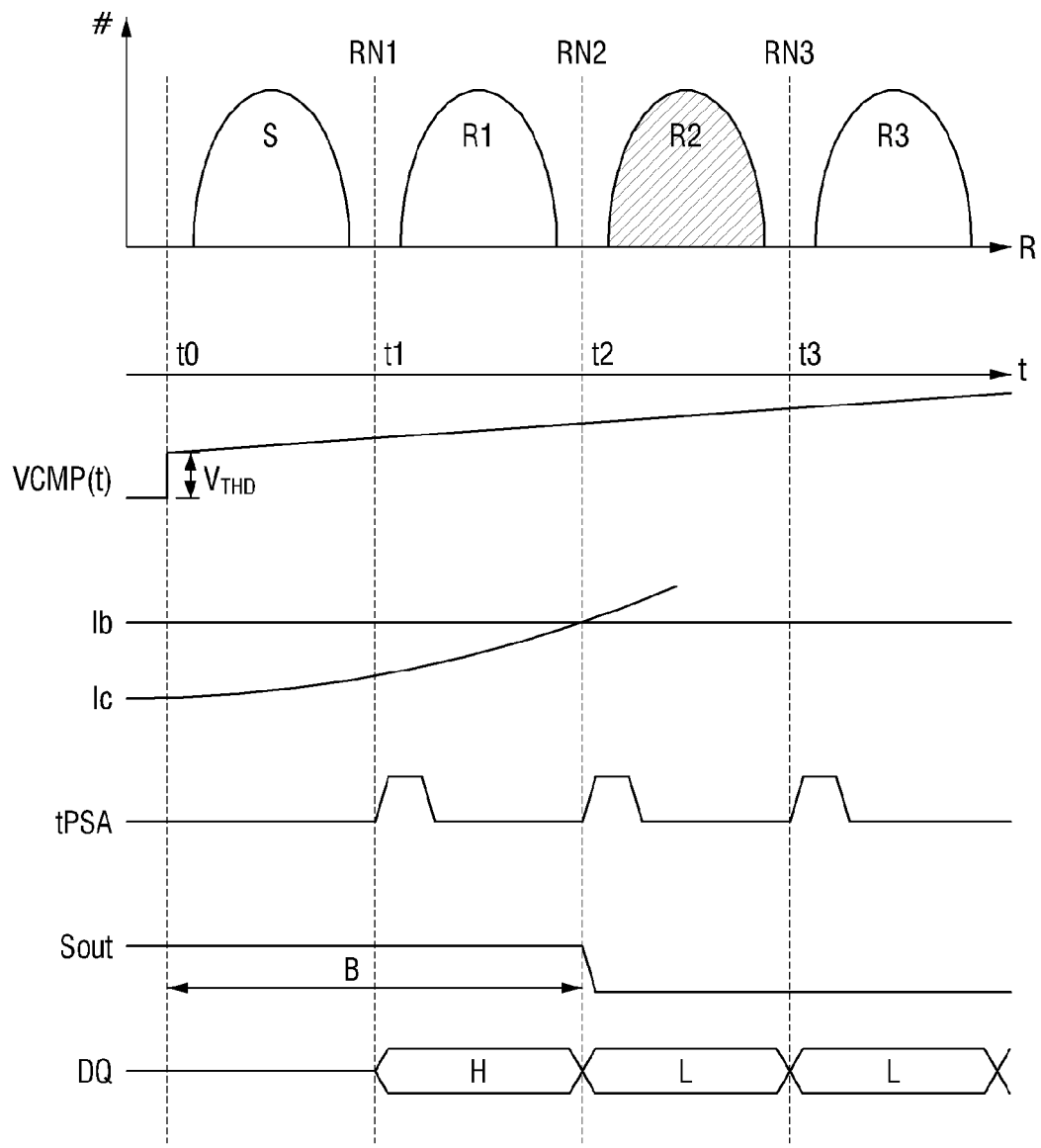
Figure 8:
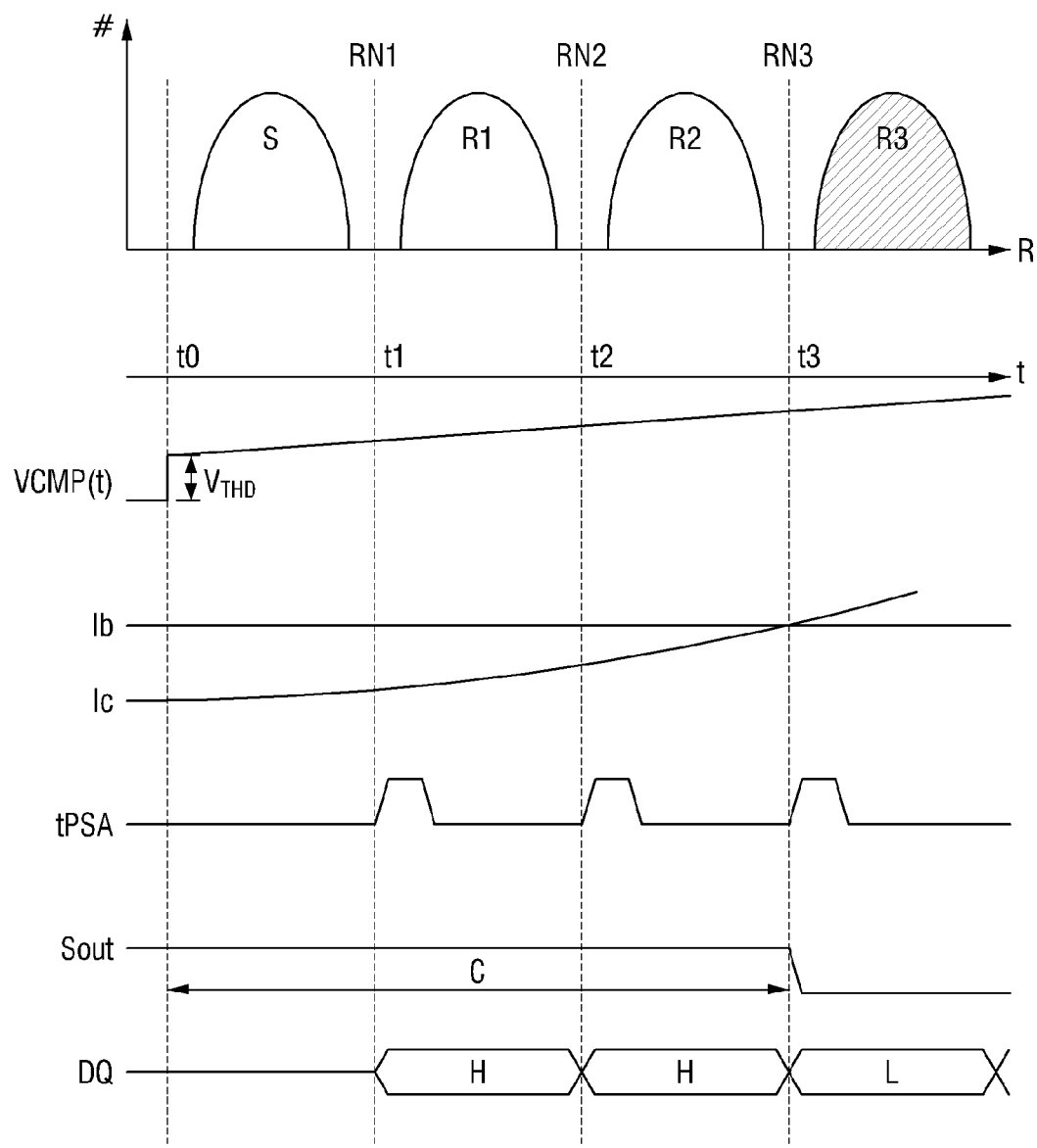

FIGS. 6 through 8 are timing diagrams illustrating a method of driving a nonvolatile memory device according to embodiments of the present disclosure. In FIGS. 6 through 8, a normal read operation is illustrated.

FIG. 6 is a timing diagram illustrating a case where the second data R1 is stored in the resistive memory cell 170.

Referring to FIG. 6, a read operation may begin at a time t0. The first clamping bias VCMP(t) may be enabled. As shown in the drawing, an initial value of the first clamping bias VCMP(t) may be a threshold voltage $V_{THD}$ of the access element D of the resistive memory cell 170. The compensation current Ib may remain constant, and the first clamping bias VCMP(t) may increase over time. As the first clamping bias VCMP(t) increases, the cell current Ic flowing through the resistive memory cell 170 may begin to increase. When the compensation current Ib is greater than the cell current Ic, the output value SOUT of the sense amplifier 180 may remain at logic high.

At a time t1, the cell current Ic may increase to the compensation current Ib and ultimately become greater than the compensation current Ib. Therefore, the level of the first sensing node SN1 may begin to change. Here, the reference signal tPSA may become active. The first sense amplifier 180 may be enabled in response to the reference signal tPSA and may sense the change in the level of the first sensing node SN1.

Accordingly, the output value SOUT of the first sense amplifier 180 may transit from logic high to logic low. An encoder may be connected to an output terminal of the first sense amplifier 180. The encoder may output logic low L as a data output DQ based on the output value SOUT of the first sense amplifier 180.

Here, if the second data R1 is stored in the resistive memory cell 170, the output value SOUT of the first sense amplifier 180 may transit after a first period of time A from the time t0 when the first clamping bias VCMP(t) begins to be provided.

At a time t2, the reference signal tPSA may become active again. The first sense amplifier 180 may be enabled in response to the reference signal tPSA. Since the first clamping bias VCMP(t) increases continuously, the cell current Ic may also increase and may be still greater than the compensation current Ib. Therefore, the output value SOUT of the first sense amplifier 180 may remain at logic low. In addition, the encoder may output logic low L.

At a time t3, the reference signal tPSA may become active again. The first sense amplifier 180 may be enabled in response to the reference signal tPSA. Since the first clamping bias VCMP(t) increases continuously, the cell current Ic may also increase and may be still greater than the compensation current Ib. The first clamping bias VCMP(t) may increase until the phase of the phase-change material of the resistive memory cell 170 changes. Therefore, the output value SOUT of the first sense amplifier 180 may remain at logic low. In addition, the encoder may output logic low L.

Consequently, when the second data R1 is stored in the resistive memory cell 170, the encoder may output LLL.

FIG. 7 is a timing diagram illustrating a case where the third data R2 is stored in the resistive memory cell 170. Aspects and features substantially identical to those described above with reference to FIG. 6 will be omitted.

Referring to FIG. 7, a read operation may begin at a time t0. The compensation current Ib may remain constant, and the first clamping bias VCMP(t) may increase over time. As the first clamping bias VCMP(t) increases, the cell current Ic may begin to increase. However, since the compensation current Ib is greater than the cell current Ic, the output value SOUT of the first sense amplifier 180 may remain at logic high.

At a time t1, the compensation current Ib may be still greater than the cell current Ic. Accordingly, the output value SOUT of the first sense amplifier 180 may remain at logic high.

At a time t2, the cell current Ic may increase to the compensation current Ib and may ultimately become greater than the compensation current Ib. Therefore, the level of the first sensing node SN1 may begin to change. Here, the reference signal tPSA may become active. The first sense amplifier 180 may be enabled in response to the reference signal tPSA, and may sense the change in the level of the first sensing node SN1. Accordingly, the output value SOUT of the first sense amplifier 180 may transit from logic high to logic low. The encoder may output logic low L as the data output DQ based on the output value SOUT of the first sense amplifier 180.

Here, if the third data R2 is stored in the resistive memory cell 170, the output value SOUT of the first sense amplifier 180 may transit after a second period of time B from the time t0 when the first clamping bias VCMP(t) begins to be provided.

At a time t3, the reference signal tPSA may become active. The first sense amplifier 180 may be enabled in response to the reference signal tPSA. Since the first clamping bias VCMP(t) increases, the cell current Ic may also increase and may be still greater than the compensation current Ib. Therefore, the output value SOUT of the first sense amplifier 180 may still remain at logic low. In addition, the encoder 190 may output logic low L.

Consequently, when the third data R2 is stored in the resistive memory cell 170, the encoder may output HLL.

FIG. 8 is a timing diagram illustrating a case where the fourth data R3 is stored in the resistive memory cell 170. Aspects and features substantially identical to those described above with reference to FIG. 6 will be omitted.

Referring to FIG. 8, a read operation may begin at a time t0. The compensation current Ib may remain constant, and the first clamping bias VCMP(t) may increase over time. As the first clamping bias VCMP(t) increases, the cell current Ic may begin to increase.

At times t1 and t2, the compensation current Ib may be still greater than the cell current Ic. Accordingly, the output value SOUT of the first sense amplifier 180 may remain at logic high.

At a time t3, the cell current Ic may increase to the compensation current Ib and ultimately may become greater than the compensation current Ib. Therefore, the level of the first sensing node SN1 may begin to change. Here, the reference signal tPSA may become active. The first sense amplifier 180 may be enabled in response to the reference signal tPSA, and may sense the change in the level of the first sensing node SN1. Accordingly, the output value SOUT of the first sense amplifier 180 may transit from logic high to logic low. The encoder may output logic low L as the data output DQ based on the output value SOUT of the first sense amplifier 180.

Here, if the fourth data R3 is stored in the resistive memory cell 170, the output value SOUT of the first sense amplifier 180 may transit after a third period of time C from the time t0 when the first clamping bias VCMP(t) begins to be provided.

Consequently, when the fourth data R3 is stored in the resistive memory cell 170, the encoder may output HHL.

Referring to FIGS. 6 through 8, in nonvolatile memory devices according to embodiments of the inventive concept, the time (see A of FIG. 6, B of FIG. 7, and C of FIG. 8) when the output value SOUT of the first sense amplifier 180 transits may vary according to data stored in the resistive memory cell 170.

Furthermore, the encoder connected to the output terminal of the first sense amplifier 180 may output a different logic value based on data stored in the resistive memory cell 170. That is, the encoder may output LLL, HLL, HHL, HHH, or the like based on data stored in the resistive memory cell 170.

As described above with reference to FIGS. 6 through 8, in a normal read operation, the reference signal tPSA may become active when the level of the first sensing node SN1 changes. Since the first sense amplifier 180 is enabled at a time when the reference signal tPSA becomes active, it is important for the reference signal tPSA to operate stably without being shaken by a change in pressure-volume-temperature (PVT). Also, it is required to stably generate the reference signal tPSA and appropriately trim the reference signal tPSA if necessary.

Figure 9:
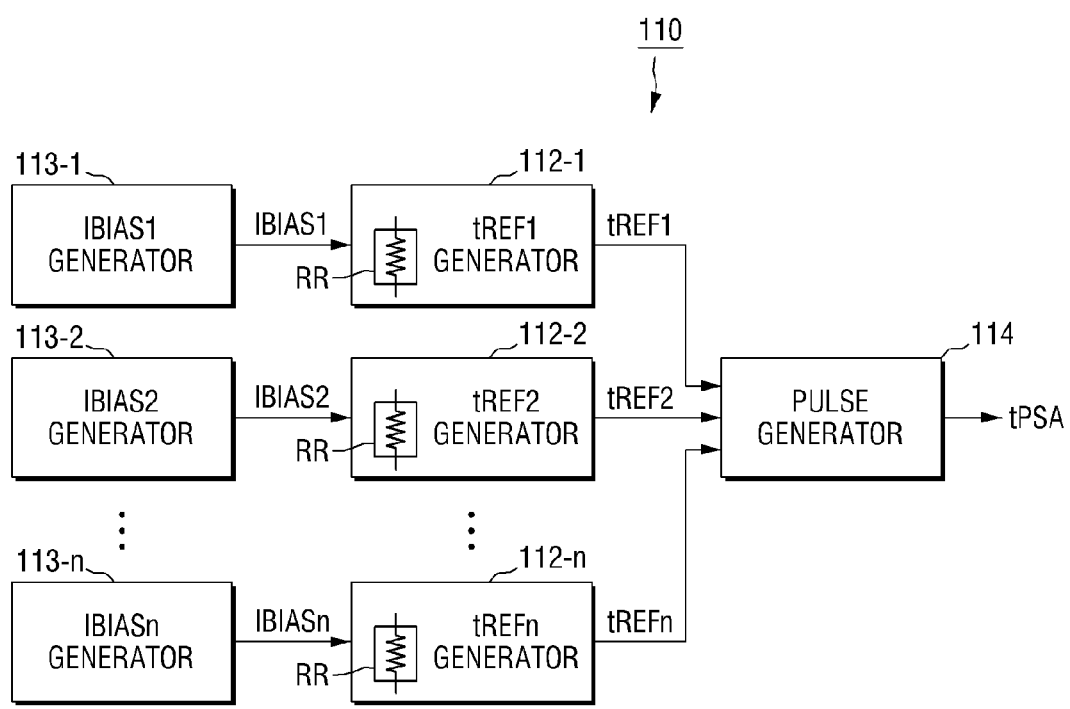
FIG. 9 is a block diagram of a reference signal generator of FIG. 4 and a plurality of reference current generators.
Figure 10:
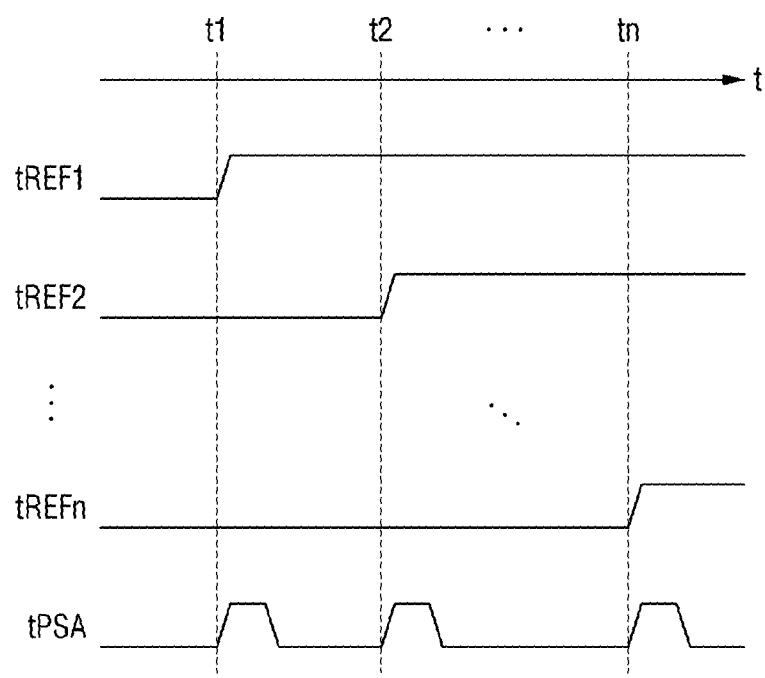
FIG. 10 is a timing diagram of the reference signal generator illustrated in FIG. 4.

FIG. 9 is a block diagram of the reference signal generator 110 of FIG. 4, which includes a plurality of reference current generators 113_1 through 113_n. FIG. 10 is a timing diagram of the reference signal generator 110 illustrated in FIG. 4.

Referring to FIG. 9, the plurality of reference current generators 113_1 through 113_n may provide a plurality of reference currents IBIAS1 through IBIASn to a plurality of reference blocks 112_1 through 112_n, respectively. Here, the plurality of reference currents IBIAS1 through IBIASn may vary according to data (i.e., a resistance value) that is to be measured.

The reference signal generator 110 may include the plurality of reference blocks 112_1 through 112_n (n is a natural number), and a pulse generator 114.

The plurality of reference blocks 112_1 through 112_n may generate a plurality of reference output signals tREF1 through tREFn. Specifically, each of the plurality of reference blocks 112_1 through 112_n may include a reference resistor RR. Here, the reference resistors RR may be the same. In addition, the reference resistors RR may be fixed resistors.

The pulse generator 114 may receive the plurality of reference output signals tREF1 through tREFn and may generate a reference signal tPSA.

Referring to FIG. 10, at a time t1, the first reference output signal tREF1 of the first reference block 112_1 may become active. At a time t2, the second reference output signal tREF2 of the second reference block 112_2 may become active. In addition, at a time tn, the $n^{th}$ reference output signal tREFn of the $n^{th}$ reference block 112_n may become active.

Whenever each of the first through $n^{th}$ reference output signals tREF1 through tREFn becomes active, the reference signal tPSA may transit from logic low to logic high.

Although the reference resistors RR respectively included in the plurality of reference blocks 112_1 through 112_n are the same, since different reference currents IBIAS1 through IBIASn are respectively supplied to the plurality of reference blocks 112_1 through 112_n, the plurality of reference output signals tREF1 through tREFn corresponding to different data may be output. In addition, the transition timing of the plurality of reference output signals tREF1 through tREFn can be adjusted by trimming the plurality of reference currents IBIAS1 through IBIASn supplied to the plurality of reference blocks 112_1 through 112_n. Therefore, despite a change in the PVT, the transition timing of the plurality of reference output signals tREF1 through tREFn can be adjusted stably by controlling the plurality of reference currents IBIAS1 through IBIASn.

Figure 11:
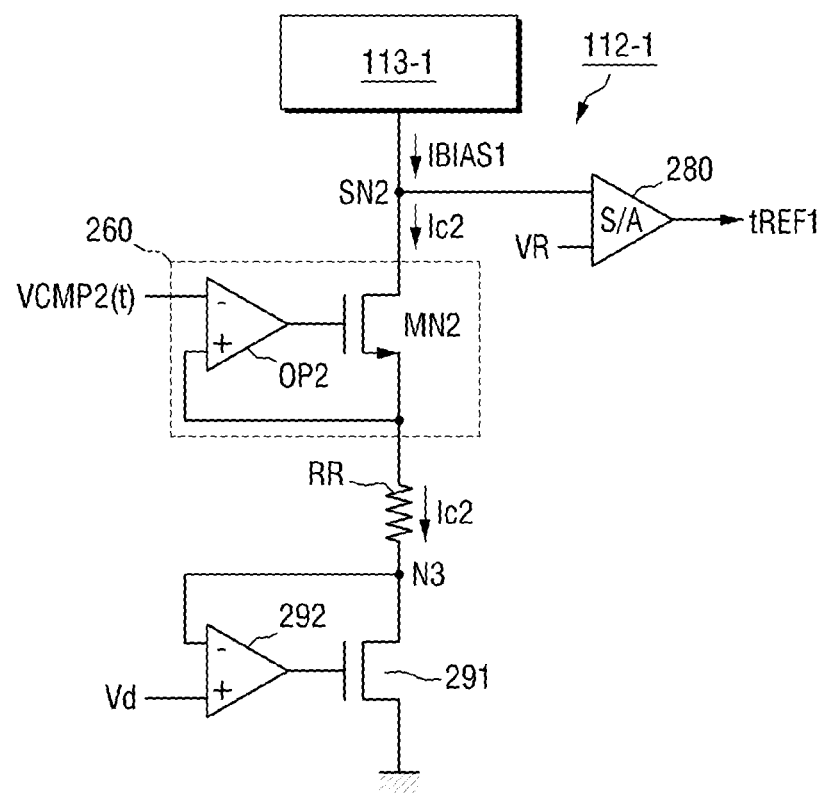
FIG. 11 is a circuit diagram of a reference block illustrated in FIG. 9.
Figure 12:
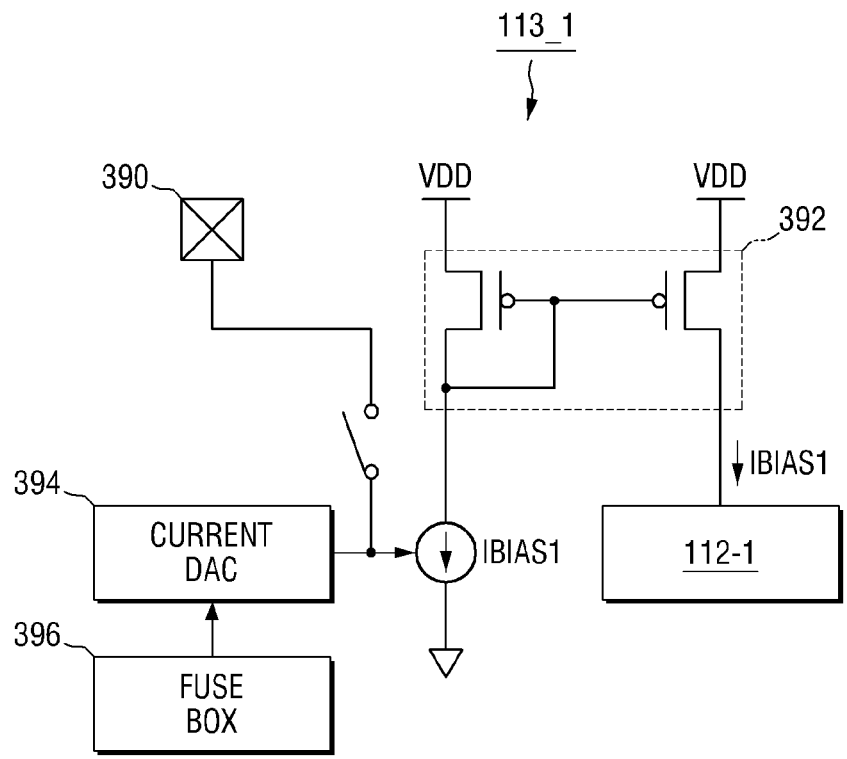
FIG. 12 is a circuit diagram of a reference current generator illustrated in FIG. 9.
Figure 13:
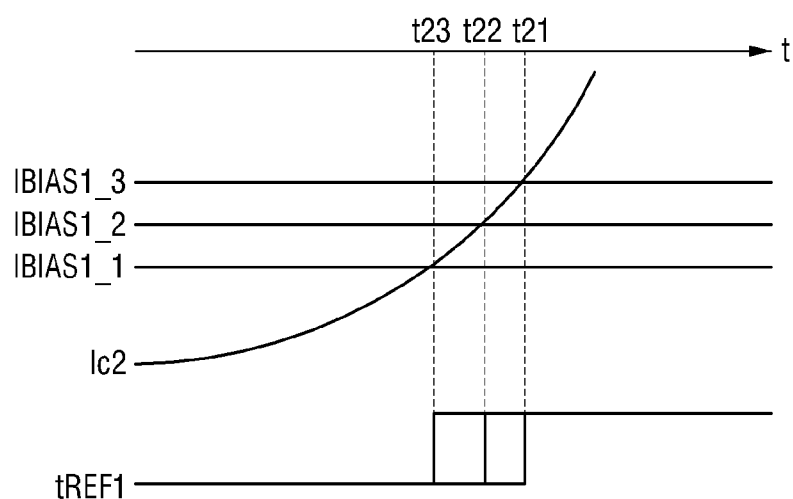
FIG. 13 is a diagram illustrating a process of trimming a reference current using a reference current generator.

FIG. 11 is a circuit diagram of a reference block illustrated in FIG. 9. FIG. 12 is a circuit diagram of a reference current generator illustrated in FIG. 9. FIG. 13 is a diagram illustrating a process of trimming a reference current using a reference current generator.

Referring to FIG. 11, a reference block (e.g., 112_1) may include a reference resistor RR, a second sensing node SN2, a second clamping unit 260, and a second sense amplifier 280.

The reference resistor RR may copy a cell resistor (i.e., the variable resistive element GST of FIG. 5). The reference resistor RR may be a fixed resistor as described above.

A transistor 291 may be formed between the reference resistor RR and a ground source, and an OP amplifier 292 may be connected to a gate of the transistor 291. The transistor 291 and the OP amplifier 292 may copy a cell diode (i.e., the access element D of FIG. 5). The OP amplifier 292 may be configured to control a negative feedback using a constant voltage Vd. Specifically, a positive (+) terminal of the OP amplifier 292 may be connected to the constant voltage Vd, and a negative (−) terminal of the OP amplifier 292 may be connected to a node N3 located between the reference resistor RR and the transistor 291. Therefore, the voltage of the node N3 may be adjusted to the constant voltage Vd. The constant voltage Vd may be substantially equal to a threshold voltage Vth of the cell diode (i.e., the access element D of FIG. 5). For example, the constant voltage Vd may be in a range of approximately 0.7 to 0.9 V. The threshold voltage Vth of the cell diode (i.e., the access element D of FIG. 5) may vary based on a manufacturing process. Thus, the transistor 291 and the OP amplifier 292 can be made to be substantially identical to the cell diode (i.e., the access element D of FIG. 5) by appropriately trimming the magnitude of the constant voltage Vd.

A reference current generator 113_1 may provide a reference current IBIAS1 to the second sensing node SN2.

The second clamping unit 260 may be connected between the reference resistor RR and the second sensing node SN2. The second clamping unit 260 may include an NMOS transistor MN2 and an OP amplifier OP2. The second clamping unit 260 may provide a second clamping bias VCMP2($t$) to the reference resistor RR. The second clamping bias VCMP2($t$) may vary over time during a read period. The second clamping bias VCMP2($t$) may be the same as the first clamping bias VCMP(t). For example, like the first clamping bias VCMP(t), the second clamping bias VCMP(t) may increase over time. The second clamping bias VCMP2($t$) may increase over time in a stepped manner or in the form of a $k^{th}$ function (where k is a natural number).

However, the first clamping bias VCMP(t) and the second clamping bias VCMP2($t$) may not necessarily be the same. The first clamping bias VCMP(t) and the second clamping bias VCMP2($t$) can also be generated and controlled separately.

The second sense amplifier 280 may be connected to the second sensing node SN2 and may sense a change in the level of the second sensing node SN2. Specifically, the second sense amplifier 280 may output a reference output signal tREF1 by comparing the level of the second sensing node SN2 with a reference level VR.

Referring to FIG. 12, the reference current generator 113_1 may include a test pad 390, a current digital-to-analog converter (DAC) 394, a fuse box 396, and a current mirror 392.

The fuse box 396 may store the appropriate magnitude of the reference current IBIAS1 based on a test result. The current DAC 394 may receive an output value of the fuse box 396 and may determine the magnitude of the reference current IBIAS1. The test pad 390 may provide test reference currents IBIAS1_1 through IBIAS1_3 to a current source during a test operation.

A process of determining the appropriate magnitude of a reference current (e.g., IBIAS1) (that is, a process of trimming the reference current IBIAS1) in the test operation will now be described with reference to FIGS. 12 and 13.

A test reference current (e.g., IBIAS1_1) may be provided through the test pad 390. A current having the same magnitude as the test reference current IBIAS1_1 may be provided to the reference block 112_1 through the current mirror 392. Since the reference resistor RR is a fixed resistor, the transition timing of the reference output signal tREF1 may change based on the magnitude of the test reference current IBIAS1_1. That is, at a time t21 in FIG. 13, the reference output signal tREF1 may transit from low to high. The pulse generator 114 (see FIG. 9) may receive the reference output signal tREF1 and may generate the reference signal tPSA.

A second test reference current (e.g., IBIAS1_2) may also be provided through the test pad 390. As described above, the reference output signal tREF1 may transit from low to high at a time t22 of FIG. 13 based on the magnitude of the test reference current IBIAS1_2.

A third test reference current (e.g., IBIAS1_3) may be provided through the test pad 390. As described above, the reference output signal tREF1 may transit from low to high at a time t23 of FIG. 13 based on the magnitude of the test reference current IBIAS1_3.

In this way, various test reference currents IBIAS1_1 through IBIAS1_3 may be tested, and then a test reference current (e.g., IBIAS1_2) that can transit the reference output signal tREF1 at an appropriate time (e.g., at the time t22) may be selected as the reference current IBIAS1. The magnitude of the determined test reference current (e.g., IBIAS1_2) may be stored in the fuse box 396.

That is, the reference currents IBIAS1 through IBIASn may be currents trimmed based on test results during or after a process of manufacturing a nonvolatile memory device. Therefore, the reference currents IBIAS1 through IBIASn can be determined by reflecting all condition changes that can occur in the process of manufacturing a nonvolatile memory device.

The reference resistor RR has been described above as a fixed resistor. However, a variable resistor can also be used depending on design.

Figure 14:
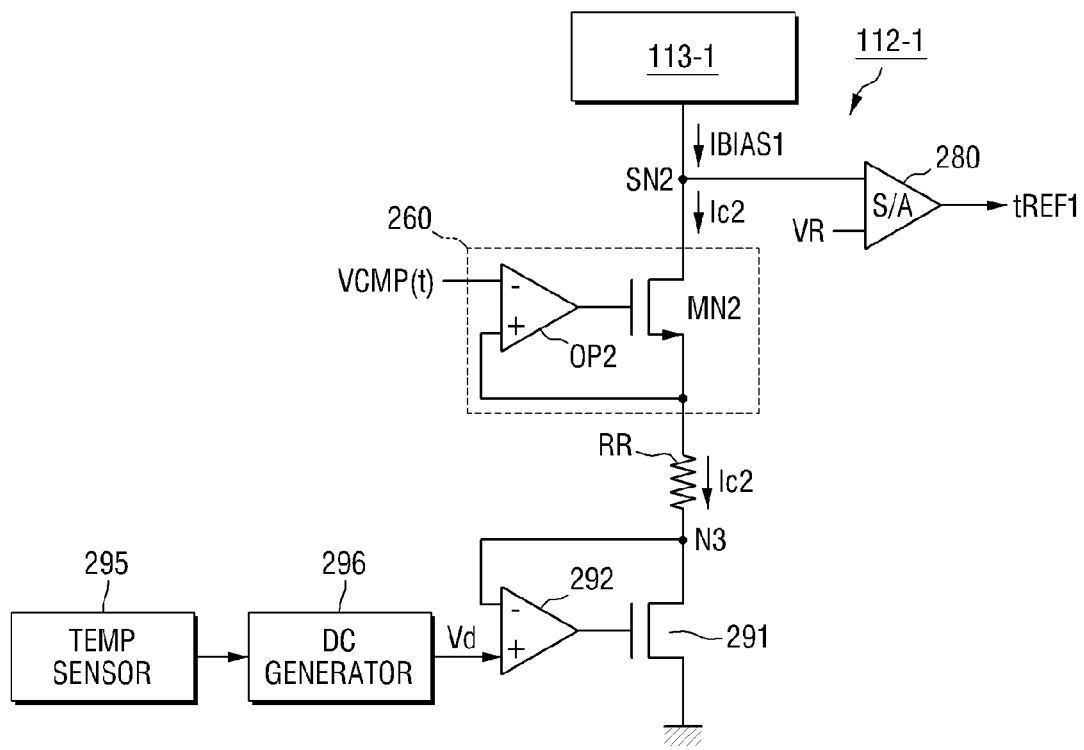
FIG. 14 is a diagram illustrating a reference block used in a nonvolatile memory device according to another embodiment of the inventive concept.

FIG. 14 is a diagram illustrating a reference block used in a nonvolatile memory device according to another embodiment of the inventive concept. For simplicity, the current embodiment will be described, focusing mainly on differences with the embodiment of FIG. 11.

Referring to FIG. 14, a reference resistor RR may copy a cell resistor (i.e., the variable resistive element GST of FIG. 5). In addition, a transistor 291 and an OP amplifier 292 may copy a cell diode (i.e., the access element D of FIG. 5).

A threshold voltage of the cell diode (i.e., the access element D of FIG. 5) may vary based on temperature. Therefore, a temperature sensor 295 may be connected to a constant voltage generator 296 which provides a constant voltage Vd. The constant voltage generator 296 may adjust the magnitude of the constant voltage Vd based on an output value of the temperature sensor 295.

Figure 15:
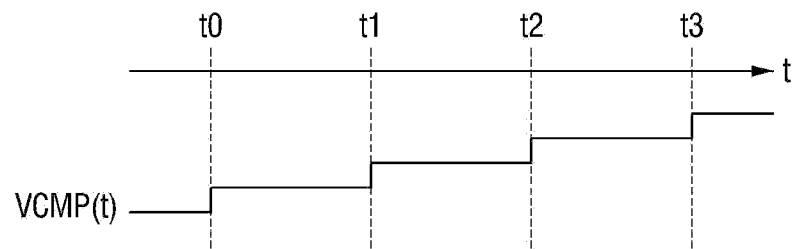
FIGS. 15, 16 and 17 are diagrams illustrating examples of a first clamping bias used in nonvolatile memory devices according to embodiments of the inventive concept.
Figure 16:
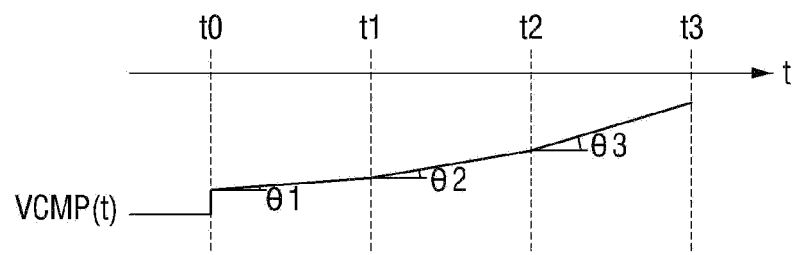
Figure 17:
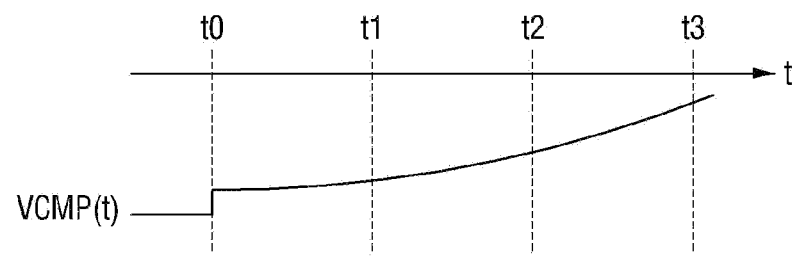

FIGS. 15 through 17 are diagrams illustrating examples of the first clamping bias VCMP(t) used in nonvolatile memory devices according to embodiments of the inventive concept.

Referring to FIG. 15, the first clamping bias VCMP(t) may increase over time in a stepped fashion.

Referring to FIG. 16, the first clamping bias VCMP(t) may have a different slope in each period. For example, the first clamping bias VCMP(t) may have a slope of θ1 in a period of t0 to t1, a slope of θ2 in a period of t1 to t2, and a slope of θ3 in a period of t2 to t3. Here, θ2 may be, but is not limited to, greater than θ1, and θ3 may be, but is not limited to, greater than θ2.

Referring to FIG. 17, the first clamping bias VCMP(t) may increase over time in the form of a $k^{th}$ function, where k is a natural number. In FIG. 17, the first clamping bias VCMP(t) may increase in the form of a quadratic function, but the inventive concept is not limited thereto.

FIGS. 18 through 22 are diagrams illustrating memory systems according to embodiments of the inventive concept. Specifically, FIGS. 18 through 22 are diagrams illustrating memory systems using nonvolatile memory devices according to embodiments of the inventive concept.

Figure 18:
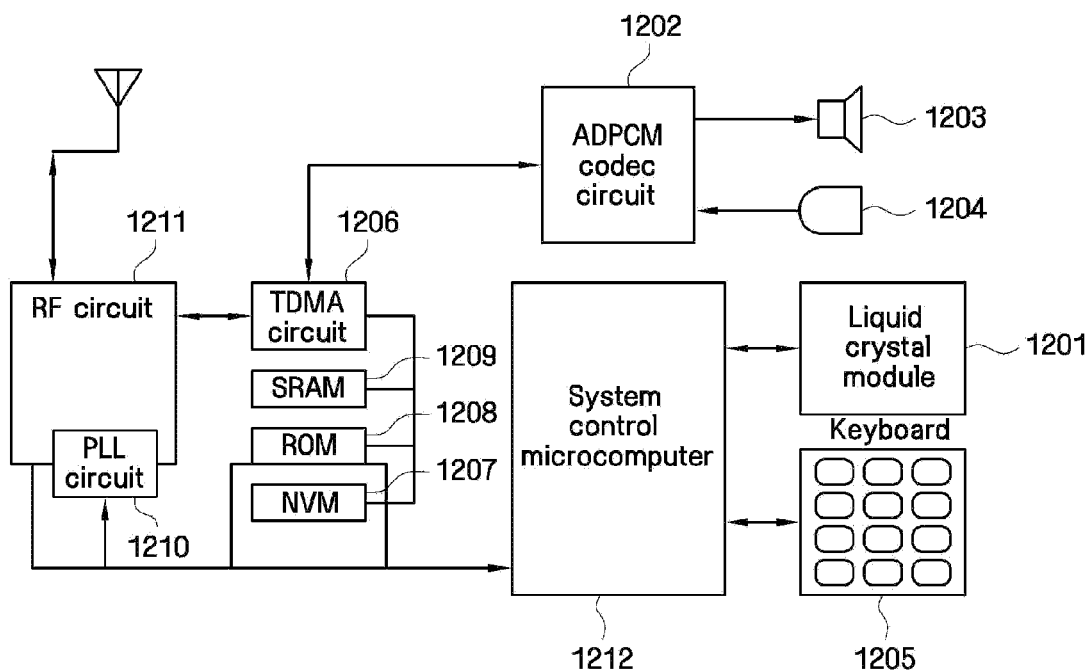
FIGS. 18, 19, 20, 21 and 22 are diagrams illustrating memory systems according to embodiments of the inventive concept.

FIG. 18 is a diagram illustrating a cellular phone system which uses nonvolatile memory devices according to embodiments of the inventive concept.

Referring to FIG. 18, the cellular phone system may include a liquid crystal module 1201, an adaptive differential pulse code modulation (ADPCM) codec circuit 1202 which compresses sound or decompresses compressed sound, a speaker 1203, a microphone 1204, a keyboard 1205, a time division multiple access (TDMA) circuit 1206 which time-divisionally multiplexes digital data, a phase-locked loop (PLL) circuit 1210 which sets a carrier frequency of a wireless signal, and a radio frequency (RF) circuit 1211 which transmits or receives a wireless signal.

In addition, the cellular phone system may include various types of memory devices. For example, the cellular phone system may include a nonvolatile memory device 1207, a read only memory (ROM) 1208, and a static random access memory (SRAM) 1209. The nonvolatile memory device 1207 may be any nonvolatile memory device according to embodiments of the inventive concept, and may store, for example, an identification (ID) number. The ROM 1208 may store programs, and the SRAM 1209 may serve as a work area for a system control microcomputer 1212 or may temporarily store data. The system control microcomputer 1212 may be a processor and may control a write operation and a read operation of the nonvolatile memory device 1207.

Figure 19:
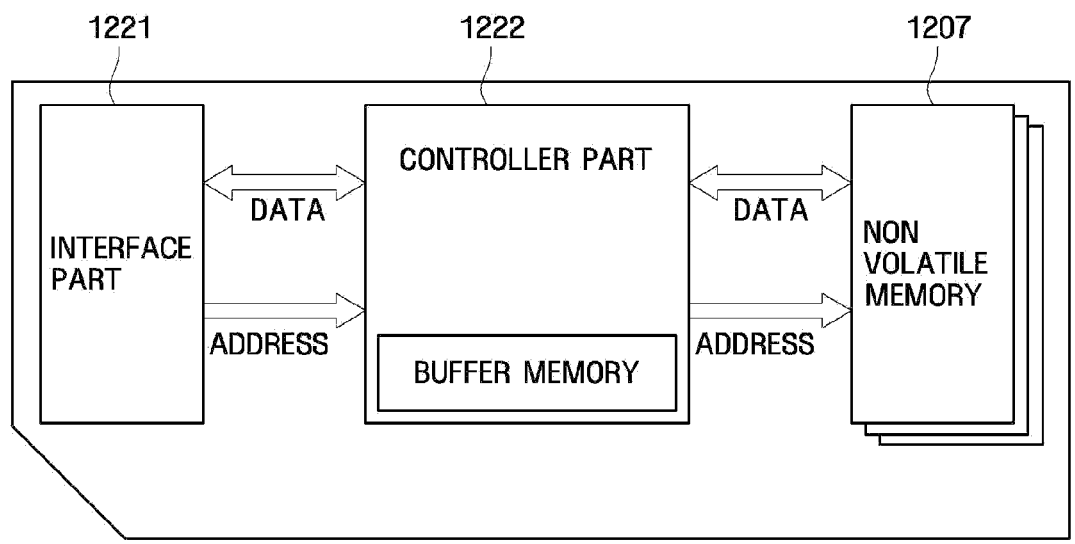

FIG. 19 is a diagram illustrating a memory card which uses nonvolatile memory devices according to embodiments of the inventive concept. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 19, the memory card may include an interface part 1221 which interfaces with an external device, a controller part 1222 which includes a buffer memory and controls an operation of the memory card, and one or more nonvolatile memory devices 1207 according to embodiments of the inventive concept. The controller part 1222 may be a processor and may control the write and read operations of the nonvolatile memory devices 1207. Specifically, the controller part 1222 may be coupled to the interface part 1221 and to each of the nonvolatile memory devices 1207 by a data bus DATA and an address bus ADDRESS.

Figure 20:
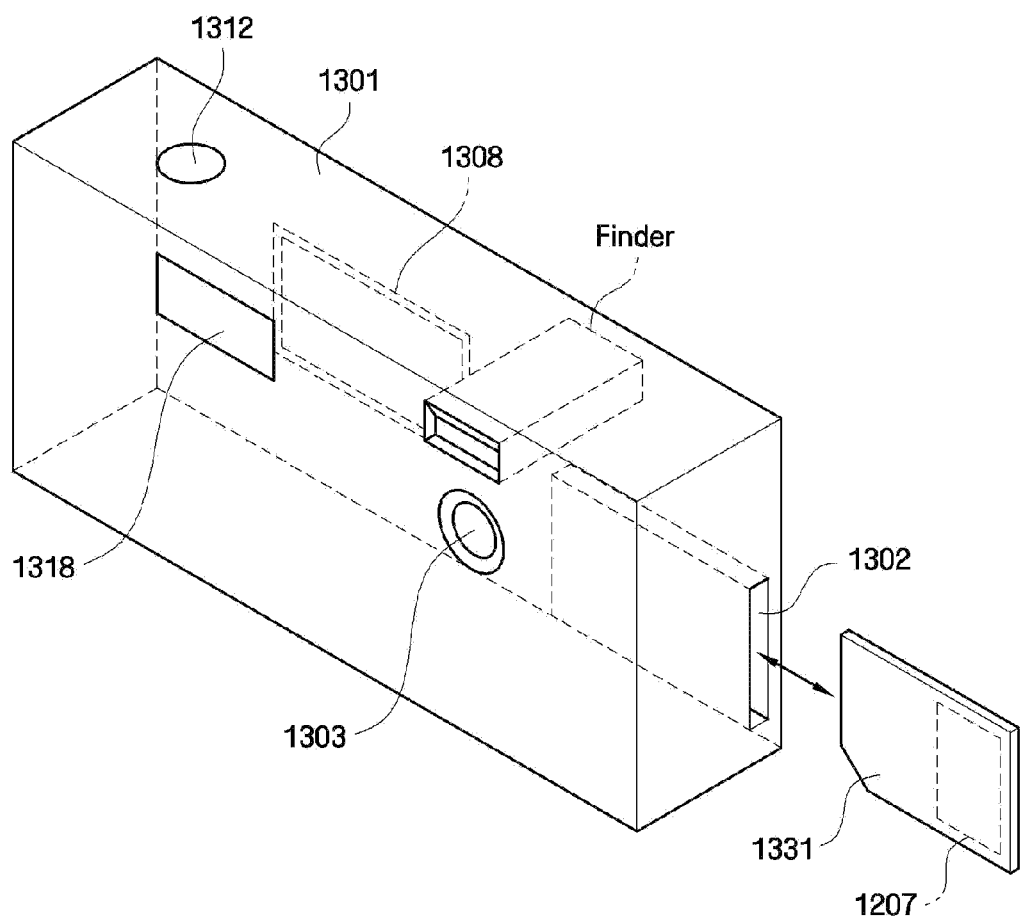

FIG. 20 is a diagram illustrating a digital still camera which uses nonvolatile memory devices according to embodiments of the inventive concept.

Referring to FIG. 20, the digital still camera may include a body 1301, a slot 1302, a lens 1303, a display 1308, a shutter button 1312, and a strobe 1318. In particular, a memory card 1331 may be inserted into the slot 1302 and may include one or more nonvolatile memory devices 1207 according to embodiments of the inventive concept.

If the memory card 1331 is of a contact type, the contact type of memory card may electrically contact a specified electrical circuit on a circuit board when the memory card 1331 is inserted into the slot 1302. If the memory card 1331 is of a non-contact type, the non-contact type of memory card may communicate using a wireless signal.

Figure 21:
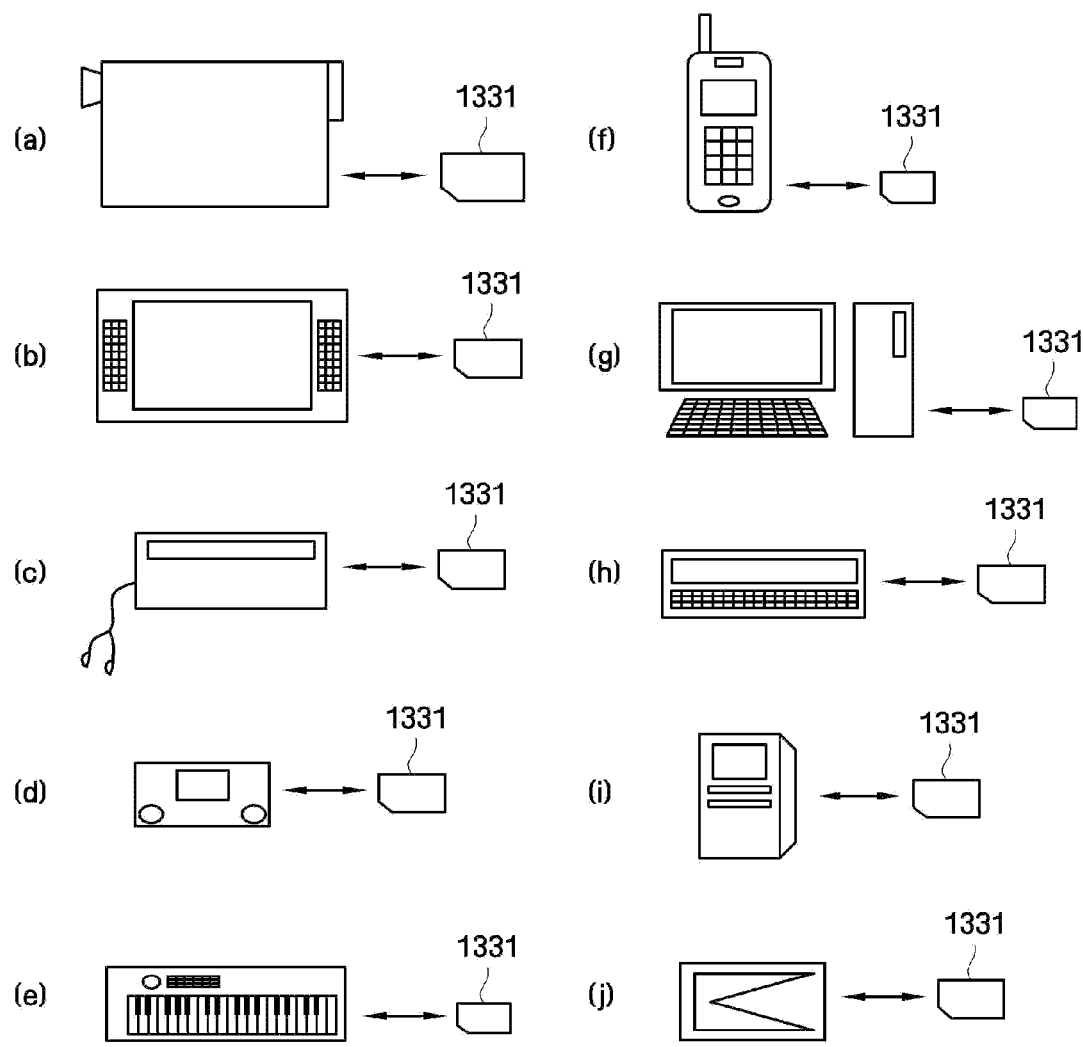

FIG. 21 is a diagram illustrating various systems which use the memory card of FIG. 19.

Referring to FIG. 21, a memory card 1331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 22:
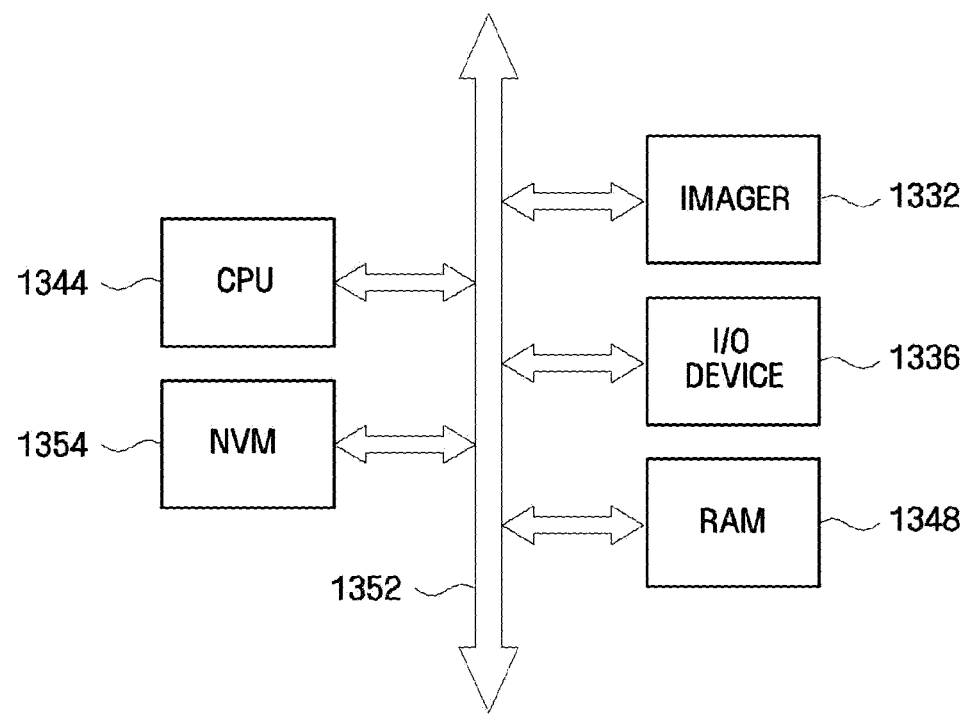

FIG. 22 is a diagram illustrating an image sensor system which uses nonvolatile memory devices according to embodiments of the inventive concept.

Referring to FIG. 22, the image sensor system may include an imager 1332, an input/output device 1336, a random access memory (RAM) 1348, a central processing unit (CPU) 1344, and a nonvolatile memory device 1354 according to embodiments of the inventive concept. These components, i.e., the imager 1332, the input/output device 1336, the RAM 1348, the CPU 1344, and the nonvolatile memory device 1354, may communicate with each other using a bus 1352. The imager 1332 may include a photo sensing element such as a photogate or a photodiode. All of the above components may be implemented as a single chip together with a processor, or these components may be implemented as a separate chip from the processor.

Figure 23:
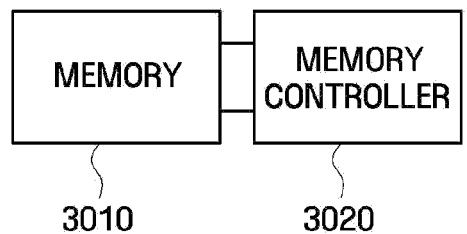
FIG. 23 is a block diagram of an exemplary memory system which uses nonvolatile memory devices according to embodiments of the inventive concept.

FIG. 23 is a block diagram of an exemplary memory system which uses nonvolatile memory devices according to embodiments of the inventive concept.

Referring to FIG. 23, a memory 3010 may be coupled to a memory controller 3020. The memory 3010 may be any of the nonvolatile memory devices according to the above-described embodiments. The memory controller 3020 may supply input signals for controlling an operation of the memory 3010. For example, the memory controller 3020 may send a command CMD and address signals. The memory controller 3020 may include a memory interface, a host interface, an error correction code (ECC) circuit, a CPU, and a buffer memory. The memory interface may provide data transmitted from the buffer memory to the memory 3010 or may transmit data read out of the memory 3010 to the buffer memory. Also, the memory interface may provide a command or an address received from an external host to the memory 3010.

The host interface may communicate with an external host through a universal serial bus (USB), a small computer system interface (SCSI), a peripheral component interconnect (PCI) express, an AT attachment (ATA), a parallel ATA (PATA), a serial ATA (SATA), or a serial attached SCSI (SAS) interface.

A memory system according to embodiments of the inventive concept may include an ECC circuit, which generates a parity bit using data transmitted to the memory 3010. The generated parity bit may be stored in a specific area of the memory 3010, together with the data. The ECC circuit may detect an error of data read out of the memory 3010. If the detected error is correctable, the ECC circuit may correct the detected error.

The CPU may control the external host or the memory 3010 through the host interface or the memory interface. The CPU may control write, read, and erase operations depending on firmware for driving a memory.

The buffer memory may temporarily store write data provided from an external source or data read out of the memory 3010. Also, the buffer memory may store meta data or cache data that is to be stored in the memory 3010. During a sudden power-off operation, the meta data or the cache data stored in the buffer memory may be stored in the memory 3010. The buffer memory may be a dynamic random access memory (DRAM) or an SRAM.

Figure 24:
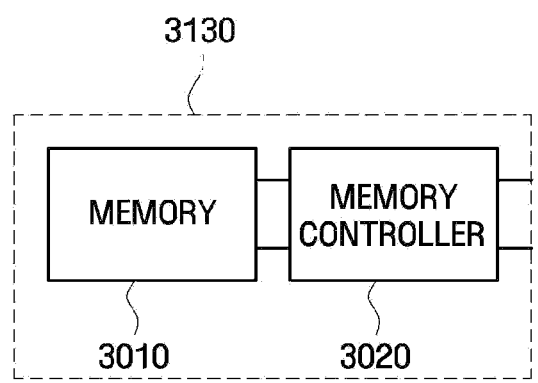
FIG. 24 is a block diagram of another exemplary memory system which uses nonvolatile memory devices according to embodiments of the inventive concept.

FIG. 24 is a block diagram of another exemplary memory system which uses nonvolatile memory devices according to embodiments of the inventive concept. This memory system is substantially the same as the memory system of FIG. 23, except that a memory 3010 and a memory controller 3020 are embedded in a card 3130. For example, the card 3130 may be a flash memory card. Namely, the card 3130 may be a standard product used in a consumer electronics device such as a digital camera, a personal computer, and so on. The memory controller 3020 may control the memory 3010 based on control signals received from another (e.g., external) device.

Figure 25:
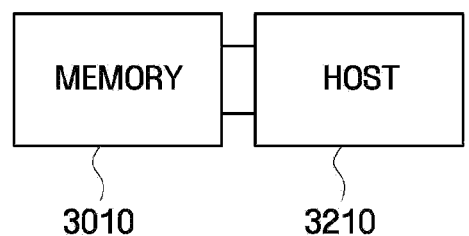
FIG. 25 is a block diagram of another exemplary memory system which uses nonvolatile memory devices according to embodiments of the inventive concept.

FIG. 25 is a block diagram of another exemplary memory system which uses nonvolatile memory devices according to embodiments of the inventive concept. Referring to FIG. 25, a memory 3010 may be coupled to a host system 3210. The host system 3210 may be a processing system such as a personal computer, a digital camera, and so on. The host system 3210 may use the memory 3010 as an erasable storage medium. As described above, the host system 3210 may supply input signals for controlling operation of the memory 3010. For example, the host system 3210 may supply a command CMD and address signals.

Figure 26:
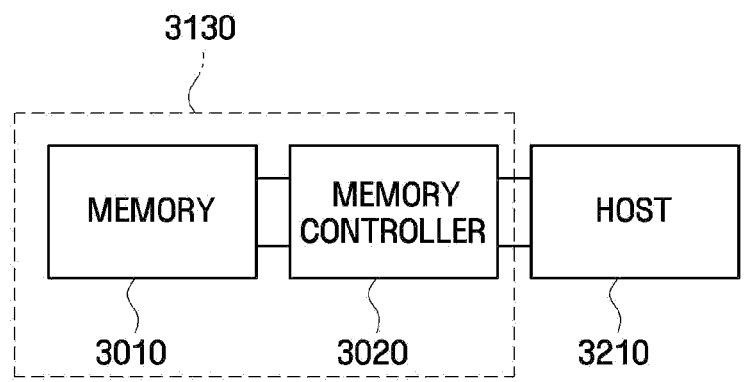
FIG. 26 is a block diagram of another exemplary memory system which uses nonvolatile memory devices according to embodiments of the inventive concept.

FIG. 26 is a block diagram of another exemplary memory system which uses nonvolatile memory devices according to embodiments of the inventive concept. Referring to FIG. 26, a host system 3210 may be coupled to a card 3130. In this embodiment, the host system 3210 may transmit control signals to the card 3130, such that the memory controller 3020 may control the operation of a memory 3010.

Figure 27:
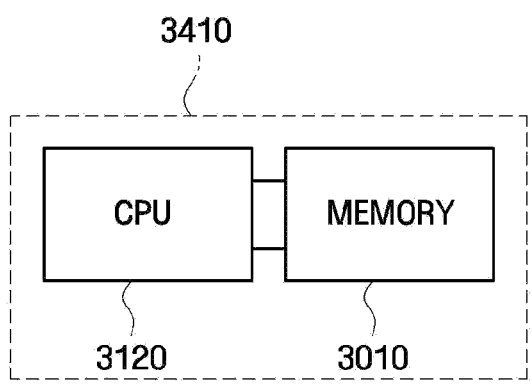
FIG. 27 is a block diagram of another exemplary memory system which uses nonvolatile memory devices according to embodiments of the inventive concept.

FIG. 27 is a block diagram of another exemplary memory system which uses nonvolatile memory devices according to embodiments of the inventive concept. Referring to FIG. 27, a memory 3010 may be connected to a CPU 3120 within a computer system 3410. For example, the computer system 3410 may be a personal computer, a PDA, and so on. The memory 3010 may be directly connected with the CPU 3120, or connected via a bus, and so on.

A nonvolatile memory device according to embodiments of the inventive concept may be used as a storage class memory (SCM), which is the general concept of memories capable of simultaneously providing nonvolatile characteristics and access characteristics. The SCM may be utilized as not only data storage space but also program execution space.

The above-described nonvolatile memory devices using resistance materials, such as a PRAM, an RRAM and an MRAM, may be appropriate examples of the SCM. The SCM may be used as not only a data storage memory instead of a flash memory but also a main memory instead of an SRAM. Moreover, one SCM may be used instead of a flash memory and an SRAM.

Figure 28:
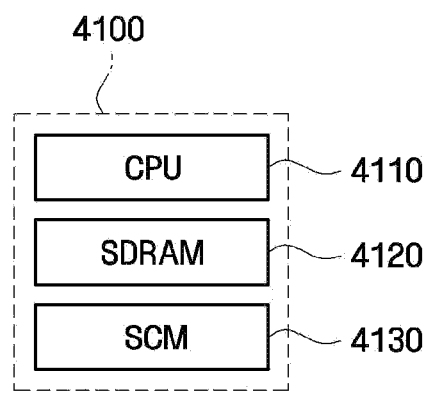
FIG. 28 is a block diagram of a memory system which uses a storage class memory (SCM).

FIG. 28 is a block diagram of a memory system 4100 which uses an SCM. Referring to FIG. 28, the memory system 4100 may include a CPU 4110, a synchronous DRAM (SDRAM) 4120, and an SCM 4130 used instead of a flash memory.

In the memory system 4100, a data access speed of the SCM 4130 may be greater than that of the flash memory. For example, under a PC environment where the CPU 4110 runs at 4 GHz, a data access speed of a PRAM which is a kind of the SCM 4130 may be about 32 times greater than that of the flash memory. Thus, the memory system 4100 equipped with the SCM 4130 may attain a higher-speed access gain than a memory system equipped with the flash memory.

Figure 29:
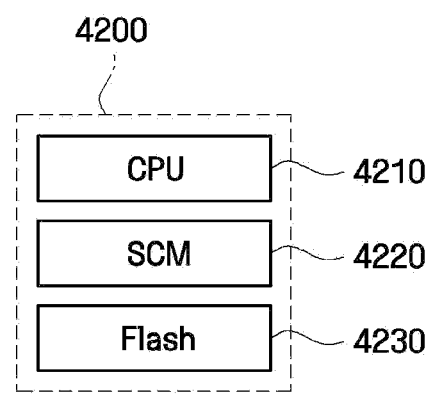
FIG. 29 is a block diagram of another exemplary memory system which uses an SCM.

FIG. 29 is a block diagram of another exemplary memory system 4200 which uses an SCM. Referring to FIG. 29, the memory system 4200 may include a CPU 4210, an SCM 4220 used instead of an SDRAM, and a flash memory 4230.

In the memory system 4200, power dissipation of the SCM 4220 may be less than that of the SDRAM. Energy dissipated by the main memory of a computer system may amount to about 40 percent of total energy. The SCM 4220 may reduce dynamic energy dissipation by an average of as much as about 53 percent and may also reduce energy dissipation caused by power leakage by an average of as much as about 73 percent. As a result, the memory system 4200 equipped with the SCM 4220 may allow power dissipation to be reduced compared to a memory system equipped with the SDRAM.

Figure 30:
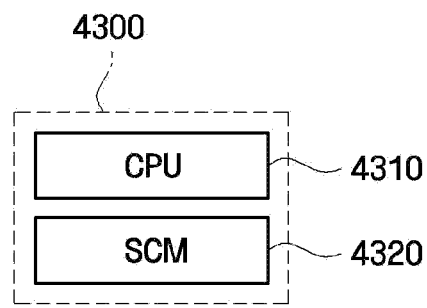
FIG. 30 is a block diagram of another exemplary memory system which uses an SCM.

FIG. 30 is a block diagram of another exemplary memory system 4300 which uses an SCM. Referring to FIG. 30, the memory system 4300 may include a CPU 4310 and an SCM 4320 used instead of an SDRAM and a flash memory. The SCM 4320 may be used as a main memory instead of the SDRAM and as a data storage memory instead of the flash memory. The memory system 4300 may be advantageous in a data access speed, low power, space utilization, and cost.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A nonvolatile memory device comprising:
   a resistive memory cell;
   a reference current generator configured to provide a reference current;
   a reference signal generator configured to provide a reference signal indicating a reference time for data read based on the reference current; and
   a read circuit configured to receive the reference signal and to read data by comparing a ramp-up time of a cell current flowing through the resistive memory cell with the reference time.

2. The nonvolatile memory device of claim 1, wherein the reference current is trimmed based on a test result.

3. The nonvolatile memory device of claim 1, wherein the reference current generator comprises a fuse box and a current digital-to-analog converter (DAC), the current DAC configured to receive an output value of the fuse box and to determine a magnitude of the reference current based on the received output value.

4. The nonvolatile memory device of claim 1, wherein the reference current generator is configured to operate in a normal read period, and the reference current generator comprises a test pad which provides the reference current in a test operation.

5. The nonvolatile memory device of claim 1, wherein the read circuit comprises:
   a first clamping unit connected between the resistive memory cell and a first sensing node, the first clamping unit configured to provide a first clamping bias to the resistive memory cell;
   a first compensation unit configured to provide a compensation current to the first sensing node; and
   a first sense amplifier connected to the first sensing node, the first sense amplifier configured to sense a change in a level of the first sensing node in response to the reference signal,
   wherein the first clamping bias ramps up over time.

6. The nonvolatile memory device of claim 5, wherein the reference signal generator comprises:
   a reference resistor;
   a second clamping unit connected between the reference resistor and a second sensing node, the second clamping unit configured to provide a second clamping bias to the reference resistor; and
   a second sense amplifier connected to the second sensing node, the second sense amplifier configured to sense a change in a level of the second sensing node,
   wherein the second clamping bias ramps up over time.

7. The nonvolatile memory device of claim 6, wherein the reference resistor is a fixed resistor.

8. The nonvolatile memory device of claim 6, wherein the first clamping bias and the second clamping bias are the same.

9. The nonvolatile memory device of claim 6, further comprising a transistor connected to the reference resistor and an operational (OP) amplifier connected to a gate of the transistor,
   wherein a positive terminal of the OP amplifier is connected to a constant voltage, and a negative terminal of the OP amplifier is connected to a node located between the reference resistor and the transistor.

10. The nonvolatile memory device of claim 9, wherein the constant voltage is adjusted by a temperature sensor.

11. A nonvolatile memory device comprising:
    a resistive memory cell;
    a first clamping unit connected between the resistive memory cell and a first sensing node, the first clamping unit configured to provide a clamping bias to the resistive memory cell;
    a first compensation unit configured to provide a compensation current to the first sensing node;
    a first sense amplifier connected to the first sensing node, the first sense amplifier configured to sense a change in a level of the first sensing node in response to a reference signal;
    a second clamping unit connected between a fixed resistor and a second sensing node, the second clamping unit configured to provide the clamping bias to the fixed resistor;
    a reference current generator configured to provide to the second sensing node a reference current that is trimmed based on a test result;
    a second sense amplifier connected to the second sensing node, the second sense amplifier configured to sense a change in a level of the second sensing node; and
    a pulse generator configured to provide the reference signal based on an output value of the second sense amplifier,
    wherein the clamping bias varies over time.

12. The nonvolatile memory device of claim 11, wherein the reference current generator comprises a fuse box and a current digital-to-analog converter (DAC), the current DAC configured to receive an output value of the fuse box and to determine a magnitude of the reference current based on the received output value.

13. The nonvolatile memory device of claim 11, wherein the reference current generator is configured to operate in a normal read period, and the reference current generator comprises a test pad which provides the reference current in a test operation.

14. The nonvolatile memory device of claim 11, further comprising a transistor connected to the fixed resistor and an OP amplifier connected to a gate of the transistor,
    wherein a positive terminal of the OP amplifier is connected to a constant voltage, and a negative terminal of the OP amplifier is connected to a node located between the fixed resistor and the transistor.

15. The nonvolatile memory device of claim 14, wherein the constant voltage is adjusted by a temperature sensor.

16. A memory card comprising:
    a controller; and
    a nonvolatile memory including:
    a resistive memory cell;

one or more reference current generators configured to provide one or more reference currents;

a reference signal generator including one or more reference blocks and a pulse generator, the reference signal generator configured to provide a reference signal indicating a reference time for data read based on each of the one or more reference currents; and a read circuit including a compensation unit, a first clamping unit and a first sense amplifier, the read circuit configured to receive the reference signal and to read data by comparing a ramp-up time of a cell current flowing through the resistive memory cell with the reference time.

17. The memory card of claim 16, wherein each of the one or more reference current generators is configured to provide a respective reference current among the one or more reference currents to a respective reference block among the one or more reference blocks, and the one or more reference blocks are configured to generate one or more reference output signals.

18. The memory card of claim 17, wherein the pulse generator is configured to receive the one or more reference output signals and to generate the reference signal.

19. The memory card of claim 16, wherein the compensation unit is configured to provide a compensation current to a sensing node to compensate for a reduction in a level of the sensing node, the sensing node connected to the compensation unit, the first clamping unit and the first sense amplifier.

20. The memory card of claim 16, wherein each of the one or more reference blocks includes a reference resistor, a second clamping unit and a second sense amplifier.

* * * * *